(12) United States Patent
Jörissen et al.

(10) Patent No.: US 10,829,860 B2
(45) Date of Patent: Nov. 10, 2020

(54) NICKEL ELECTRODE, SELF-SUPPORTING NICKEL LAYER, METHOD FOR PRODUCTION THEREOF, AND USE THEREOF

(71) Applicant: ZENTRUM FÜR SONNENENERGIE-UND WASSERSTOFF-FORSCHUNG BADEN-WÜRTTEMBERG GEMEINNUTZIGE STIFTUNG, Stuttgart (DE)

(72) Inventors: Ludwig Jörissen, Neu-Ulm (DE); Jerry Bamfo Asante, Ulm (DE); Olaf Böse, Neu-Ulm (DE)

(73) Assignee: ZENTRUM FÜR SONNENENERGIE-UND WASSERSTOFF-FORSCHUNG BADEN-WÜRTTEMBERG GEMEINNÜTZIGE STIFTUNG, Stuttgart (DE)

( * ) Notice: Subject to any disclaimer, the term of this patent is extended or adjusted under 35 U.S.C. 154(b) by 63 days.

(21) Appl. No.: 15/775,209

(22) PCT Filed: Nov. 17, 2016

(86) PCT No.: PCT/EP2016/077978
§ 371 (c)(1),
(2) Date: May 10, 2018

(87) PCT Pub. No.: WO2017/085173
PCT Pub. Date: May 26, 2017

(65) Prior Publication Data
US 2018/0355493 A1    Dec. 13, 2018

(30) Foreign Application Priority Data
Nov. 19, 2015   (DE) .................. 10 2015 120 057

(51) Int. Cl.
*C25B 11/03* (2006.01)
*C25B 11/04* (2006.01)
(Continued)

(52) U.S. Cl.
CPC .......... *C25B 11/035* (2013.01); *B01J 23/755* (2013.01); *B01J 35/0033* (2013.01); *B01J 35/08* (2013.01);
(Continued)

(58) Field of Classification Search
CPC .................................................... C25B 11/035
See application file for complete search history.

(56) References Cited

U.S. PATENT DOCUMENTS

| | | | | |
|---|---|---|---|---|
| 5,084,154 A | * | 1/1992 | Wakizoe | ............ C25B 11/0478 204/290.13 |
| 2002/0150821 A1 | | 10/2002 | Fukuda et al. | |
| 2015/0203976 A1 | | 7/2015 | Noaki et al. | |

FOREIGN PATENT DOCUMENTS

| | | |
|---|---|---|
| CN | 1152802 A | 6/1997 |
| CN | 104364425 A | 2/2015 |

(Continued)

OTHER PUBLICATIONS

Office Action dated Aug. 1, 2019 issued in corresponding Chinese Application No. 201680066843.9.
(Continued)

*Primary Examiner* — Nicholas A Smith
(74) *Attorney, Agent, or Firm* — Nath, Goldberg & Meyer; Tanya E. Harkins; Joshua B. Goldberg

(57) ABSTRACT

Nickel electrodes comprising an electrically conductive nickel sheet and a nickel layer deposited thereon which consists of spherical, porous nickel particles which adhere to each other, made by the method of partially reducing spherical nickel hydroxide particles in a reducing atmosphere at
(Continued)

elevated temperatures to obtain partially reduced spherical Ni/NiO particles, preparing a paste from the Ni/NiO particles obtained and an organic and/or inorganic binder as well as further excipients as required, applying the paste in a layer to one or both sides of the electrically conductive nickel sheet, and tempering the coated nickel sheet in a reducing atmosphere at elevated temperatures. Self-supporting nickel layers of spherical, porous nickel particles which adhere to each other. Producing nickel electrodes and the self-supporting nickel layer, and use thereof, particularly as an electrode for water electrolysis.

35 Claims, 9 Drawing Sheets

(51) Int. Cl.
| | |
|---|---|
| C25B 1/04 | (2006.01) |
| B01J 23/755 | (2006.01) |
| C02F 1/461 | (2006.01) |
| C25B 1/34 | (2006.01) |
| H01L 49/02 | (2006.01) |
| H01M 4/66 | (2006.01) |
| H01M 4/80 | (2006.01) |
| B01J 35/08 | (2006.01) |
| B01J 35/00 | (2006.01) |
| H01G 11/26 | (2013.01) |
| H01G 11/30 | (2013.01) |
| H01G 11/86 | (2013.01) |
| H01M 4/36 | (2006.01) |
| H01M 4/38 | (2006.01) |

(52) U.S. Cl.
CPC ............ *C02F 1/46114* (2013.01); *C25B 1/04* (2013.01); *C25B 1/34* (2013.01); *C25B 11/04* (2013.01); *C25B 11/0405* (2013.01); *C25B 11/0415* (2013.01); *C25B 11/0447* (2013.01); *H01L 28/00* (2013.01); *H01L 28/60* (2013.01); *H01M 4/661* (2013.01); *H01M 4/667* (2013.01); *H01M 4/801* (2013.01); *C02F 2001/46142* (2013.01); *H01G 11/26* (2013.01); *H01G 11/30* (2013.01); *H01G 11/86* (2013.01); *H01M 4/366* (2013.01); *H01M 4/38* (2013.01); *Y02E 60/36* (2013.01)

(56) References Cited

FOREIGN PATENT DOCUMENTS

| | | |
|---|---|---|
| DE | 2002298 A1 | 10/1971 |
| DE | 3612790 A1 | 10/1987 |
| DE | 3122526 C2 | 5/1988 |
| DE | 69800814 T2 | 3/2002 |
| DE | 699 11 150 T2 | 7/2004 |
| DE | 69911150 T2 | 7/2004 |
| JP | 3166393 A | 7/1991 |
| JP | 2003-328007 A | 11/2003 |
| WO | 2013191140 A1 | 12/2013 |

OTHER PUBLICATIONS

Office Action dated Mar. 21, 2018 issued in corresponding European Application No. 16797904.6.
International Search Report dated Jan. 19, 2017 issued in corresponding International Application No. PCT/EP2016/077978.

* cited by examiner

←——→ 30μm

*PRIOR ART*

PRIOR ART

PRIOR ART

NICKEL ELECTRODE, SELF-SUPPORTING NICKEL LAYER, METHOD FOR PRODUCTION THEREOF, AND USE THEREOF

This is a National Phase Application filed under 35 U.S.C. 371 as a national stage of PCT/EP2016/077978, filed Nov. 17, 2016, an application claiming the benefit of German Application No. 10 2015 120 057.0, filed Nov. 19, 2015, the content of each of which is hereby incorporated by reference in its entirety.

FIELD OF THE INVENTION

The invention relates to a nickel electrode with a nickel layer having a large surface area of spherical, porous nickel particles, a self-supporting nickel layer having a large surface area of spherical, porous nickel particles, a method for producing the nickel electrode and the self-supporting nickel layer, and use thereof, particularly as an electrode for water electrolysis.

TECHNICAL BACKGROUND AND RELATED ART

In general, it is difficult to produce layers of nickel particles that adhere firmly to nickel sheets without applying contact pressure at elevated temperature. The layers formed usually separate very easily from the carrier, the nickel sheet, again. A sintering process would require a high contact pressure at elevated temperature and thus represents a complex, expensive process. Sintered nickel electrodes have been used for nickel-cadmium rechargeable batteries and other applications since 1928 and require sintering temperatures in the range from 800-1000° C. (A K Shukla, B Hariprakash in SECONDARY BATTERIES—NICKEL SYSTEMS, Electrodes: Nickel. Page 407, Elsevier, 2009).

U.S. Pat. No. 4,605,484 describes an electrode for generating hydrogen which comprises an electrically conductive substrate with a coating thereon consisting of a chromium component and an oxide of at least one metal selected from nickel and cobalt, wherein the coating is produced by melt spraying using a complex plasma spraying process.

EP 0 226 291 A1 describes a method for prolonging the useful life of an electrode for generating hydrogen which comprises an electrically conductive substrate and a metal oxide coating, wherein a metal component of for example titanium or niobium is added to the alkaline electrolyte during the hydrogen generation. The metal oxide coating on the electrode may be prepared by plasma spraying or flame spraying, for example.

DE 2 002 298 describes a method for producing electrodes for technical water electrolysis by depositing a porous nickel layer on a metal base, wherein the porous nickel layer is oxidised anodically in an aqueous solution of alkali carbonates or alkali hydrogen carbonates and the oxidation product formed thereby is then reduced to finely distributed metallic nickel. The porous nickel layer is produced by flame spraying or arc spraying metallic nickel onto a roughened metallic base.

Various nickel electrodes are available commercially. For example, nickel sintered electrodes with rod-like nickel particles (see FIG. 1 in Morioka Y., Narukawa S., Itou T., Journal of Power Sources 100 (2001): 107-116), nickel foam electrodes with a honeycomb-like structure (see FIG. 2) or nickel fibre electrodes with cylindrical nickel fibres are known (see FIG. 3 in Ohms D., Kohlhase M., Benczur-Urmossy G., Schadlich G., Journal of Power Sources 105 (2002): 127-133.).

The aforementioned commercially available nickel electrodes are used as electrodes for batteries and are optimised for the uptake of active material.

Problem Addressed by the Invention

The problem the invention addresses is that of providing a nickel electrode while avoiding the disadvantages of the related art, which electrode has a firmly adhering nickel layer on an electrically conductive carrier of sheet nickel and high mechanical stability. The nickel electrode should also exhibit advantageous electrochemical properties, in particular enabling increased generation of oxygen and hydrogen during water hydrolysis.

A self-supporting nickel layer with advantageous properties, particularly advantageous electrochemical properties for water electrolysis, is also to be provided.

A simple, inexpensive method for producing the aforementioned nickel electrode and the aforementioned self-supporting nickel layer should also be provided. Particularly in the case of nickel electrode production, it should be possible to create nickel layers which adhere firmly to the nickel sheet.

SUMMARY OF THE INVENTION

The objects listed in the preceding text are solved according to the invention with a nickel electrode according to Claim 1, a self-supporting nickel layer according to Claim 2, a method for producing the nickel electrode according to Claim 10, a method for producing the self-supporting nickel layer according to Claim 11, and use of the nickel electrode and the self-supporting nickel layer according to Claims 12 and 13.

Preferred or particularly practical embodiments of the subject matter of the application are described in the subclaims.

One object of the invention is thus a nickel electrode, comprising a nickel electrode, comprising an electrically conductive nickel sheet and a nickel layer deposited thereon which consists of spherical, porous nickel particles which adhere to each other, which may be obtained by a method comprising the following steps:
  a) providing spherical nickel hydroxide particles,
  b) partially reducing the spherical nickel hydroxide particles in a reducing atmosphere at elevated temperatures to obtain partially reduced spherical Ni/NiO particles,
  c) preparing a paste from the Ni/NiO particles obtained and an organic and/or inorganic binder as well as further excipients as required,
  d) applying the paste in a layer to one or both sides of the electrically conductive nickel sheet, and
  e) tempering the coated nickel sheet in a reducing atmosphere at elevated temperatures.

A further object of the invention is also a self-supporting nickel layer of spherical, porous nickel particles which adhere to each other, which may be obtained by a method comprising the following steps:
  a) providing spherical nickel hydroxide particles,
  b) partially reducing the spherical nickel hydroxide particles in a reducing atmosphere at elevated temperatures to obtain partially reduced spherical Ni/NiO particles, c) preparing a paste from the Ni/NiO particles obtained and an organic and/or inorganic binder as well as further excipients as required,
d) applying the paste in a layer to a carrier,
e) tempering the coated carrier in a reducing atmosphere at elevated temperatures. and
f) separating the carrier to obtain the self-supporting porous nickel layer.

Another object of the invention is also a method for producing the nickel electrode according to the invention, comprising the following steps:
a) providing spherical nickel hydroxide particles,
b) partially reducing the spherical nickel hydroxide particles in a reducing atmosphere at elevated temperatures to obtain partially reduced spherical Ni/NiO particles,
c) preparing a paste from the Ni/NiO particles obtained and an organic and/or inorganic binder as well as further excipients as required,
d) applying the paste in a layer to one or both sides of the electrically conductive nickel sheet, and
e) tempering the coated nickel sheet in a reducing atmosphere at elevated temperatures.

A further object of the invention is a method for producing the self-supporting nickel layer according to the invention, comprising the following steps:
a) providing spherical nickel hydroxide particles,
b) partially reducing the spherical nickel hydroxide particles in a reducing atmosphere at elevated temperatures to obtain partially reduced spherical Ni/NiO particles,
c) preparing a paste from the Ni/NiO particles obtained and an organic and/or inorganic binder as well as further excipients as required,
d) applying the paste in a layer to a carrier,
e) tempering the coated carrier in a reducing atmosphere at elevated temperatures, and
f) separating the carrier to obtain the self-supporting porous nickel layer.

The object of the invention is ultimately also the use of the nickel electrode or the self-supporting nickel layer, particularly as an electrode for water electrolysis in an alkaline medium.

DETAILED DESCRIPTION OF THE INVENTION

The nickel electrode according to the invention and the self-supporting nickel layer according to the invention are characterized by a nickel layer consisting of spherical, porous nickel particles which adhere to each other and have a larger internal surface area than the nickel electrodes for batteries that were previously available commercially, such as foam, sintered or fibre electrodes.

Nickel electrodes having a nickel layer consisting of spherical, porous nickel particles are as yet unknown in industrial practice. Surprisingly, it was found that the nickel electrodes according to the invention and the self-supporting nickel layers according to the invention can be used particularly advantageously for water electrolysis in an alkaline medium, and in this process are capable of considerably more abundant gas generation during oxygen generation and particularly during hydrogen generation. This surprising effect of more abundant gas development is evidently attributable to the large internal surface area of the nickel layers. Due to the large internal surface area, the transition resistance between the electrode and the surrounding medium is very low, with the result that the current densities achievable in water hydrolysis for example are greater than those achievable with uncoated nickel sheets.

With the method according to the invention it is possible to prepare layers from nickel particies which adhere firmly to nickel sheets with simple process steps such as pressureless coating at room temperature and subsequent tempering of the coated nickel sheets. The nickel electrodes produced in this way are mechanically very stable, wherein the layers made up of spherical nickel particles also continue to adhere during and after a mechanical deformation of the nickel sheets. In peel tests, it was possible to demonstrate holding forces of up to 350 N, which could be raised further by varying the process parameters.

Moreover, the binders used leave behind no undesirable carbon deposits on the surface of the nickel layers, because they can be vaporised without residue.

The spherical nickel hydroxide particles used according to the invention are available commercially as battery material (for example from Umicore, Belgium and Tanaka, Japan) and preferably have an average particle size of 0.3-75 $\mu m$, more preferably 3-30 $\mu m$, particularly preferably 9-12 $\mu m$. Most preferred are particles with an average particle size of about 10 $\mu m$.

The partial reduction in step b) of the method according to the invention is conducted preferably at temperatures from 270-330° C., more preferably from 290-310° C.

The partial reduction takes place expediently over a period of 3 to 5 hours under the aforementioned conditions.

Both the partial reduction in step b) and the tempering in step e) of the method according to the invention are conducted in a reducing atmosphere which contains for example 10-100% hydrogen and optionally an inert gas such as nitrogen if the reducing atmosphere does not consist of 100% hydrogen.

Natural and/or synthetic polymers or derivatives thereof are particularly suitable for use as organic binders for producing a paste with the Ni/NiO particles obtained by partial reduction. Examples of suitable substances are alkyd resins, cellulose and derivatives thereof, epoxy resins, polyacrylates such as polymethyl methacrylate (PMMA) and polyacrylic acid (PAA), polychlorotrifluoroethylene (PCTFE), polyhexafluoropropylene (PHFP), polyimides (PI) and derivatives thereof, polyurethanes (PU) and derivatives thereof, polytetrafluoroethylene (PTFE), polytrifluoroethylene (PTrFE), polyvinyl alcohol (PVA), polyvinylidene difluoride (PVDF), silicones, starch and derivatives thereof, styrene-butadiene rubber (SBR) and mixtures of these materials. Particularly preferred organic binders are polyvinyl alcohols.

Additional common auxiliary substances such as organic or inorganic solvents, dispersion agents or surfactants may be added as required for preparing the paste.

Ammonium salts or hydrazine salts in aqueous media are particularly suitable for use as inorganic binders.

The final tempering of the coated nickel sheet or the coated carrier is preferably carried out at temperatures in a range from 500-800° C., more preferably from 600-700° C. The final tempering typically takes place over a period of 3 to 5 hours. The final tempering serves to completely reduce the Ni/NiO particles in order to obtain a nickel layer consisting of spherical, porous nickel particles which adhere firmly to each other. It is also designed to ensure that the binders and any auxiliary substances used are removed completely and/or are evaporated without residue.

The nickel layer of the nickel electrode according to the invention or the self-supporting nickel layer according to the invention preferably has a thickness in the range from 1-1,000 μm, more preferably 10-900 μm, and particularly preferably 20-200 μm.

The spherical, porous nickel particles preferably have an average particle size of 0.1-25 μm, more preferably 1-10 μm, still more preferably 2-6 μm, and particularly preferably 3-4 μm.

During production of self-supporting nickel layers, metal foils, metal foams, metal meshes, expanded metals, carbon foils, carbon foams, polymer foils or ceramic carriers lend themselves well for use as carriers.

When selecting the carriers, it should be ensured that such carriers can be separated from the self-supporting nickel layer again. Metallic carriers, such as aluminium foils for example, can be dissolved afterwards by treating with an acid or an alkali, so that the self-supporting, porous nickel layer remains. In the case of polymer foils, for example, it is possible to remove the foils oxidatively for example after the tempering step.

According to the invention, the nickel layers of porous nickel particles may also be doped. The particles may be doped with foreign ions before, during or after tempering.

The nickel electrodes according to the invention lend themselves particularly well to use as the working electrode in batteries, rechargeable batteries, symmetrical and asymmetrical dual-layer capacitors, sensors, as catalyst carriers, as electrodes in electrochemical synthesis processes or in photoelectric and photocatalytic devices, particularly for water electrolysis in an alkaline medium.

Applications in electrolysis, such as chlorine-alkali electrolysis, catalysis, in photovoltaic coatings and in photovoltaic hydrogen generation are particularly included.

In principle, the self-supporting nickel layers according to the invention may be used as self-supporting electrodes. However, particularly preferred is the use thereof as electrodes for the electrolysis of water, in which it is also possible nowadays to use electrodes which are completely porous.

PREFERRED EMBODIMENTS AND EXEMPLARY EMBODIMENT

Production of a Nickel Electrode According to the Invention 50 g spherical β-Ni(OH)$_2$ particles are partially reduced for 4 hours at a temperature of 300° C. in an atmosphere of 50 vol. % hydrogen in nitrogen in an annealing furnace, wherein the average particle diameter of about 10 μm was preserved. These partially reduced, spherical Ni/NiO particles already have an internal pore structure.

5 g of the partially reduced, spherical Ni/NiO particles are converted into a paste with 3 ml of a 7.5 wt. % aqueous solution of polyvinyl alcohol, which paste is then applied to one side of a 125 μm thick nickel sheet.

After a final tempering stage in the annealing furnace at a temperature of 620° C. in a reducing atmosphere of 50 vol. % hydrogen in nitrogen, the electrode formed is ready for use. The spherical nickel particles which were applied to the nickel sheet have an average diameter of 3.4 μm and have an internal pore structure.

The following Table 1 summarises the average particle sizes of the nickel hydroxide particles used, of the partially reduced Ni/NiO particles and of the spherical, porous nickel particles of the nickel layer.

TABLE 1

| Sample | Average particle size [μm] |
| --- | --- |
| β-Ni(OH)$_2$ | 10.1 |
| Partially reduced Ni/NiO | 10.3 |
| Ni particles coated on Ni sheet | 3.4 |

Oxygen Development

Figure 1:
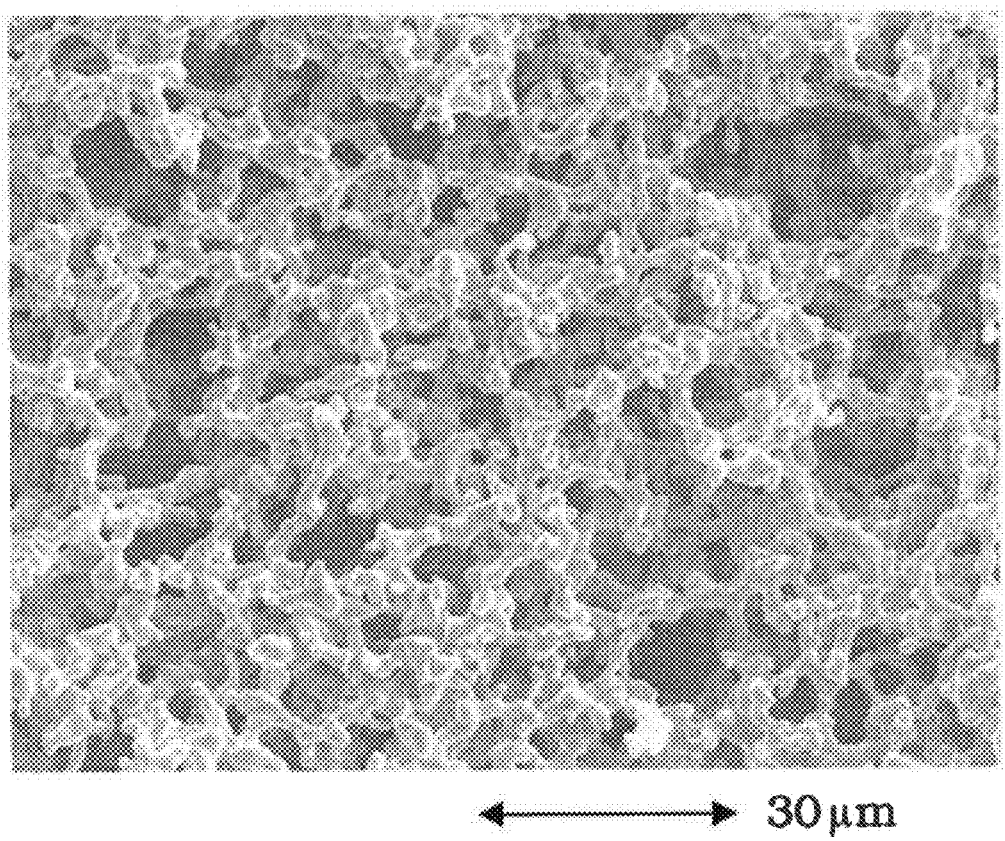
FIG. 1 shows an REM (raster electron microscope) image of the surface of a commercial nickel sintered electrode magnified 1000-fold. (from Morioka Y., Narukawa S., Itou T., Journal of Power Sources 100 (2001): 107-116)
Figure 2:
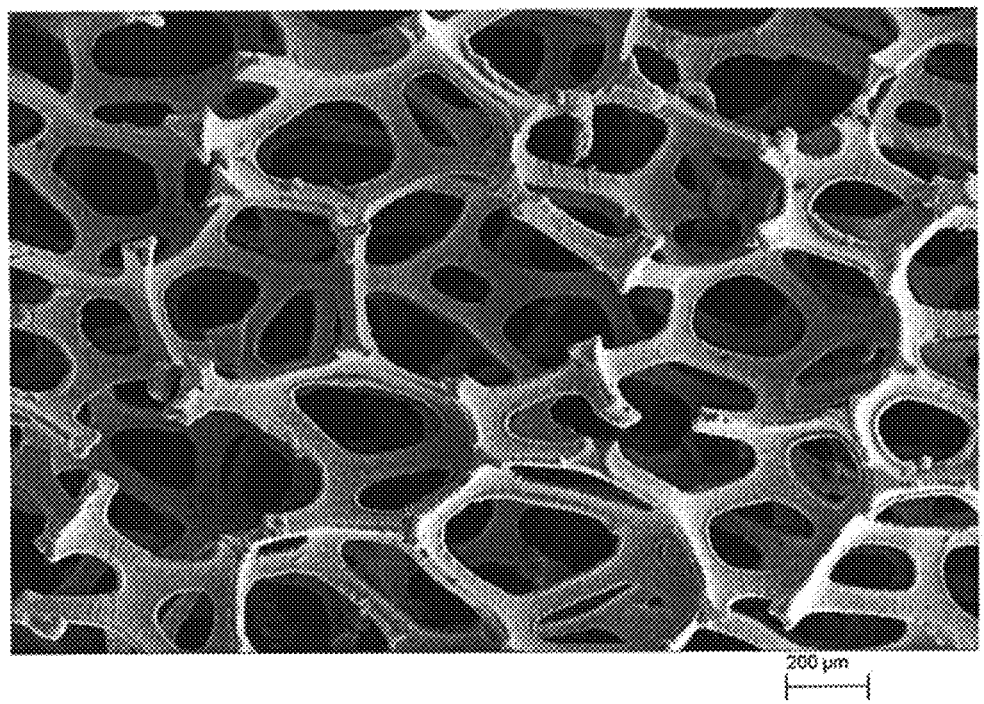
FIG. 2 shows an REM image of the surface of a commercial nickel foam electrode with honeycomb structure magnified 150-fold.
Figure 3:
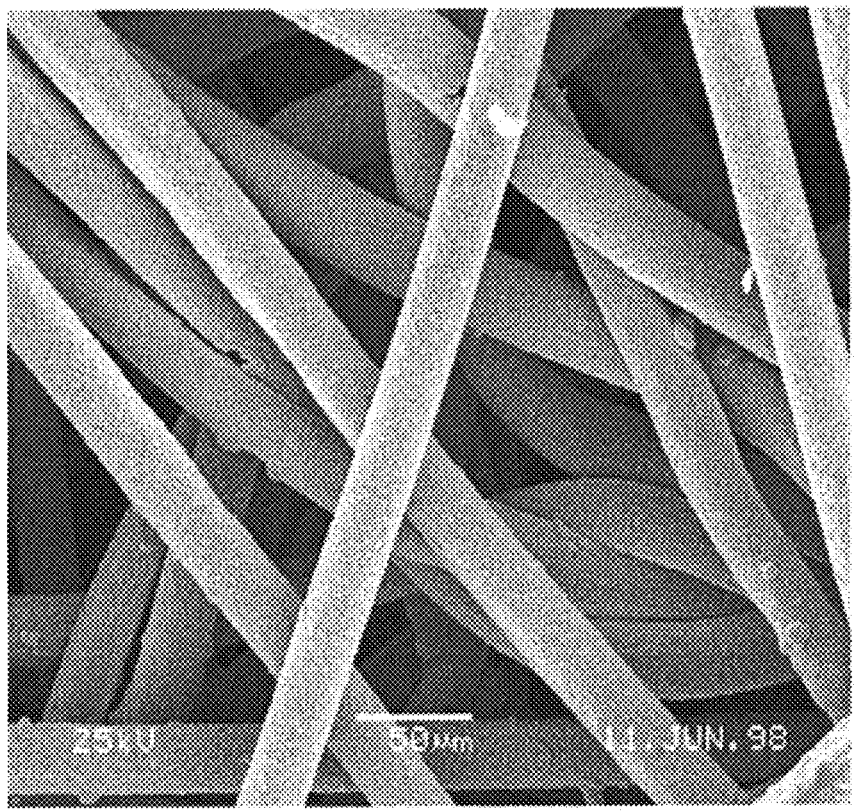
FIG. 3 shows an REM image of the surface of a commercial nickel fibre electrode magnified 500-fold. (from Ohms D., Kohlhase M., Benczur-Urmossy G., Schadlich G., Journal of Power Sources 105 (2002): 127-133)
Figure 4:
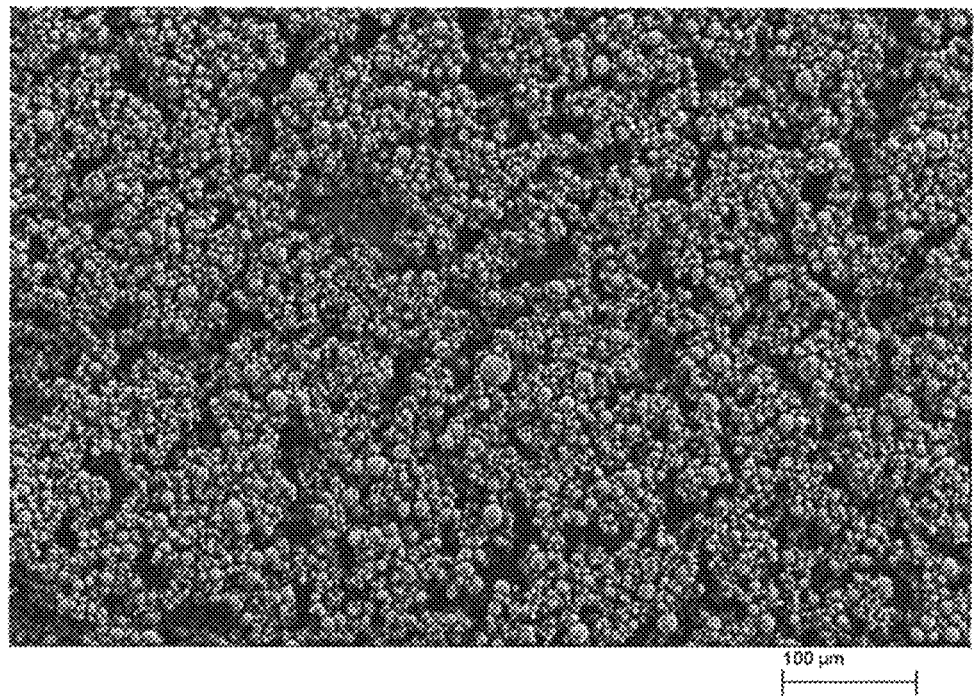
FIG. 4 shows an REM image of the surface of a nickel electrode according to the invention magnified 500-fold.
Figure 5:
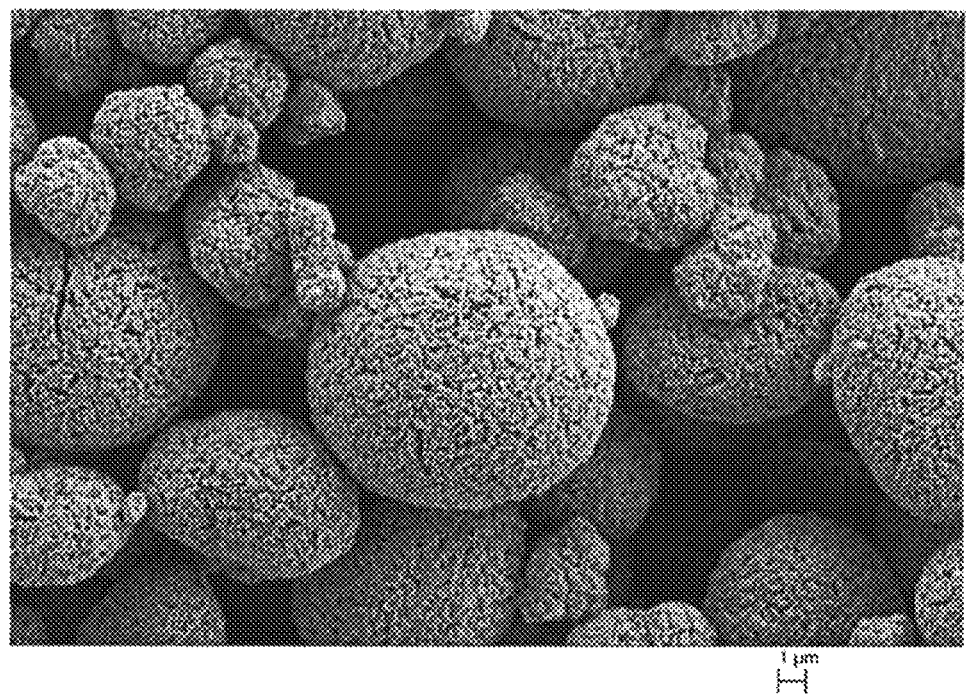
FIG. 5 shows an REM image of the surface of a nickel electrode according to the invention magnified 10,000-fold.
Figure 6A:
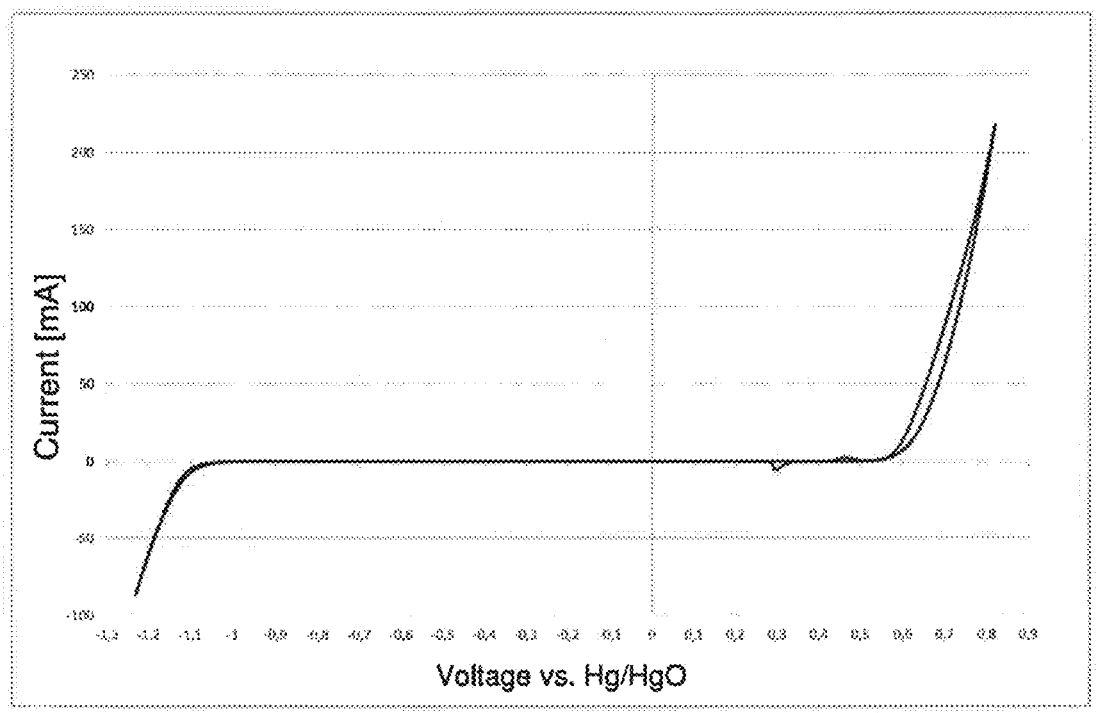
FIG. 6a shows a quasistationary cyclic voltammogram with a scan rate of 50 μV s$^{-1}$ on a 1 cm$^2$ nickel electrode for water electrolysis according to the invention in an electrolyte of 5.5 M KOH; 2.5M NaOH and 0.5M LiOH at room temperature. The rear of the electrode is coated with epoxy resin for electrical insulation.
Figure 6B:
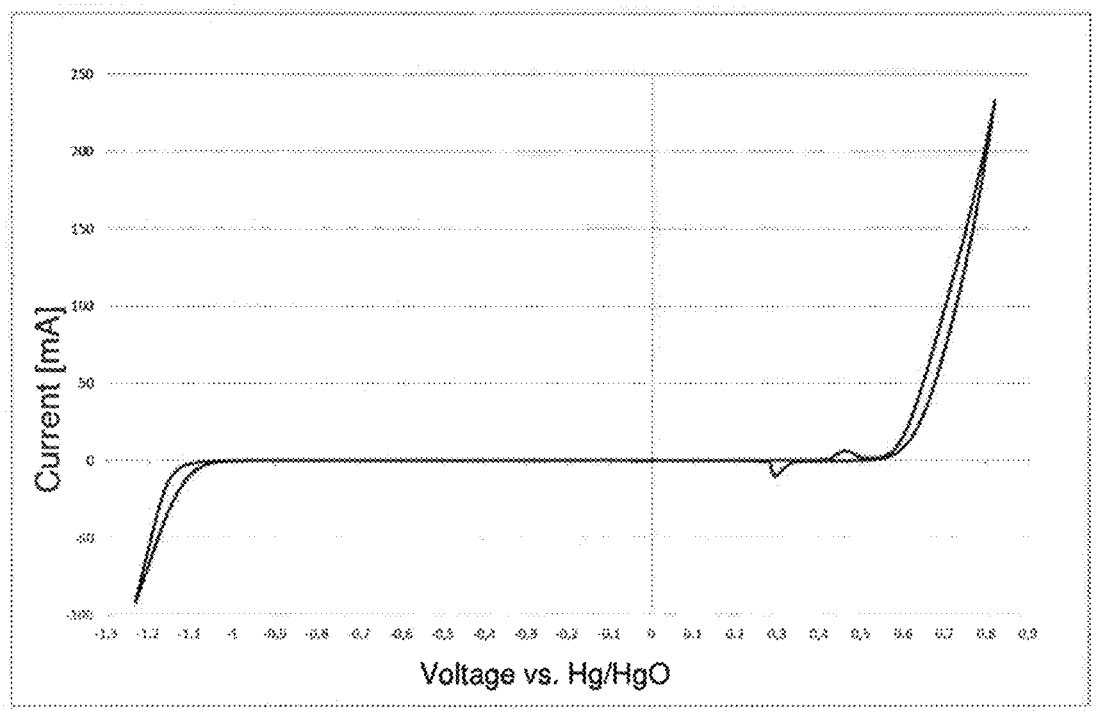
FIG. 6b shows a quasistationary cyclic voltammogram with a scan rate of 100 μV s$^{-1}$ on a 1 cm$^2$ nickel electrode for water electrolysis according to the invention in an electrolyte of 5.5 M KOH; 2.5M NaOH and 0.5M LiOH at room temperature. The rear of the electrode is coated with epoxy resin for electrical insulation.
Figure 6C:
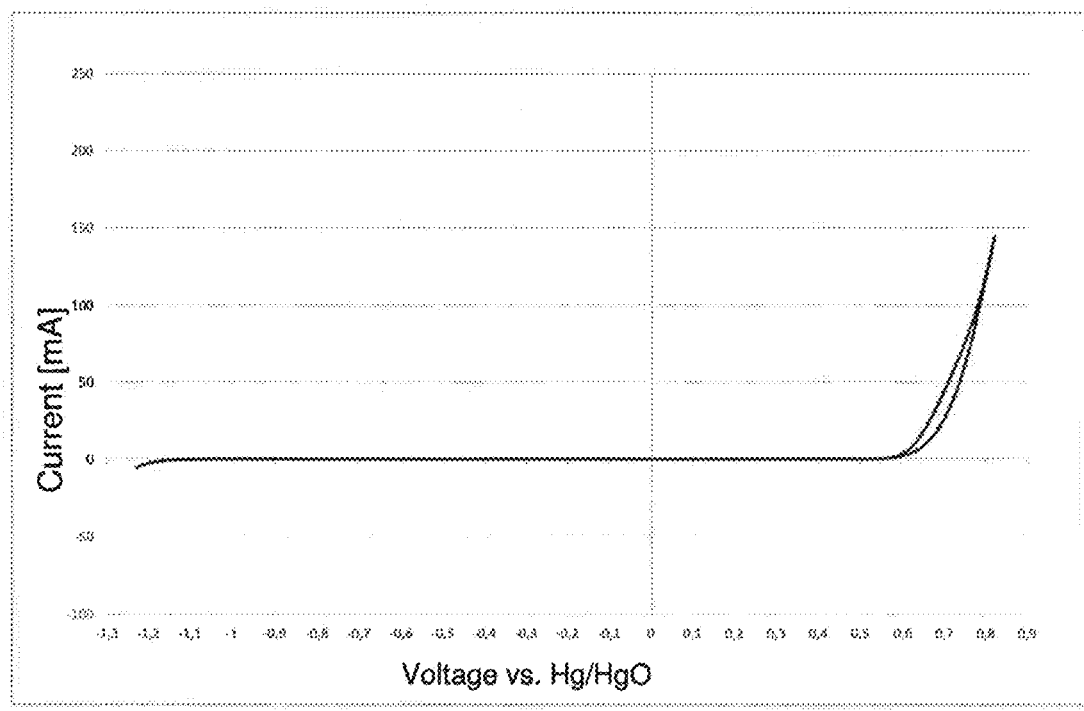
FIG. 6c shows a quasistationary cyclic voltammogram with a scan rate of 50 μV s$^{-1}$ on a flat, untreated 1 cm$^2$ nickel electrode for water electrolysis in an electrolyte of 5.5 M KOH; 2.5M NaOH and 0.5M LiOH at room temperature. The rear of the electrode is coated with epoxy resin for electrical insulation.
Figure 6D:
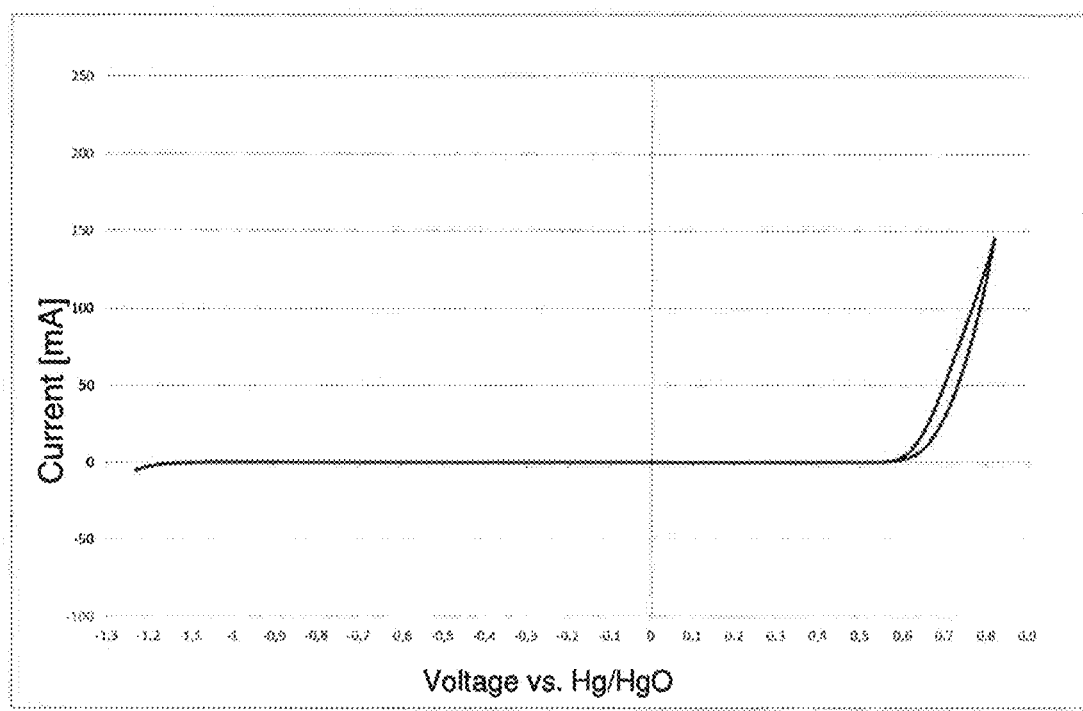
FIG. 6d shows a quasistationary cyclic voltammogram with a scan rate of 100 μV s$^{-1}$ on a flat, untreated 1 cm$^2$ nickel electrode for water electrolysis in an electrolyte of 5.5 M KOH; 2.5M NaOH and 0.5M LiOH at room temperature. The rear of the electrode is coated with epoxy resin for electrical insulation.

Because of its large internal surface area, the transition resistance between the electrode according to the invention and the surrounding medium is very low, which means that the current density that can be attained during water hydrolysis for example is greater than that provided by uncoated nickel sheets. In uncoated nickel sheets, current densities in the range of 144 mA/cm$^2$ with a voltage of 0.819 V against the Hg/HgO reference electrode, and voltage changes in the range from 50 to 100 μV/s in an electrolyte consisting of 5.5 M KOH, 2.5 M NaOH and 0.5 M LiOH are obtained. The low voltage change may be considered a quasistatic measurement. The selected potential of 0.819 V against the Hg/HgO reference is attributable solely to oxygen development. With nickel electrodes having large surface areas produced with the method according to the invention, current densities of between 218-232 mA/cm$^2$ are found under the same conditions. This corresponds to an average amplification of the current density by a factor of about 1.5 (see Tab. 2). The corresponding cyclic voltammograms are shown in FIG. 6 a-d.

TABLE 2

| Sample | Current density [mA/cm$^2$] at 50 µV/s | Current density [mA/cm$^2$] at 100 µV/s |
|---|---|---|
| Ni sheet uncoated; rear insulated with epoxy resin | 144.65 | 144.81 |
| Ni sheet coated with 3.4 µm Ni particles; rear insulated with epoxy resin | 218.67 | 232.81 |
| Average amplification factor | 1.5 | 1.6 |

Hydrogen Development

A significantly greater gas generation amplification effect due to the nickel electrodes with large surface area according to the invention may be observed for hydrogen generation. In uncoated nickel sheets, current densities in the range of 5 mA/cm$^2$ for a voltage of −1.231 V against the Hg/HgO reference electrode and a a voltage change of 50 to 100 µV/s in an electrolyte of 5.5 M KOH, 2.5 M NaOH and 0.5 M LiOH were obtained. The low voltage change may be considered as a quasistatic measurement. The selected potential of −1.231 V against the Hg/HgO reference is attributable solely to the hydrogen development. With nickel electrodes having large surface areas produced with the method according to the invention, current densities of between 86-91 mA/cm$^2$ are found under the same conditions. This corresponds to an average amplification of the current density by a factor of about 17 (see Tab. 3). The corresponding cyclic voltammograms are shown in FIG. 6 a-d.

TABLE 3

| Sample | Current density [mA/cm$^2$] at 50 µV/s | Current density [mA/cm$^2$] at 100 µV/s |
|---|---|---|
| Ni sheet uncoated; rear insulated with epoxy resin | 5.35 | 4.92 |
| Ni sheet coated with 3.4 µm Ni particles; rear insulated with epoxy resin | 86.49 | 91.29 |
| Average amplification factor | 16.2 | 18.55 |

The invention claimed is:

1. A nickel electrode, comprising an electrically conductive nickel sheet and a nickel layer consisting of spherical, porous nickel particles adhering to each other deposited thereon, obtainable with a method comprising the following steps:
    a) providing spherical nickel hydroxide particles,
    b) partially reducing the spherical nickel hydroxide particles in a reducing atmosphere at elevated temperatures to obtain partially reduced spherical Ni/NiO particles,
    c) preparing a paste from the Ni/NiO particles obtained and an organic and/or inorganic binder as well as further excipients as required,
    d) applying the paste in a layer to one or both sides of the electrically conductive nickel sheet, and
    e) tempering the coated nickel sheet in a reducing atmosphere at elevated temperatures.

2. A self-supporting nickel layer consisting of spherical, porous nickel particles which adhere to each other, obtainable with a method comprising the following steps:
    a) providing spherical nickel hydroxide particles,
    b) partially reducing the spherical nickel hydroxide particles in a reducing atmosphere at elevated temperatures to obtain partially reduced spherical Ni/NiO particles,
    c) preparing a paste from the Ni/NiO particles obtained and an organic and/or inorganic binder as well as further excipients as required,
    d) applying the paste in a layer to a carrier,
    e) tempering the coated carrier in a reducing atmosphere at elevated temperatures, and
    f) separating the carrier to obtain the self-supporting porous nickel layer.

3. The nickel electrode according to claim 1, wherein the spherical nickel hydroxide particles provided in step a) have an average particle size from 0.3-75 µm.

4. The nickel electrode according to claim 1, wherein the partial reduction in step b) is carried out at temperatures from 270-330° C.

5. The nickel electrode according to claim 1, wherein the partial reduction in step b) and the tempering in step e) are carried out in a reducing atmosphere containing 10-100% hydrogen and optionally an inert gas.

6. The nickel electrode according to claim 1, wherein in step c) natural and/or synthetic polymers or derivatives thereof are used as organic binders, and ammonium salts or hydrazine salts are used as inorganic binders.

7. The nickel electrode according to claim 1, wherein the nickel layer of the nickel electrode has a thickness in the range from 1-1,000 µm.

8. The nickel electrode according to claim 1, wherein the spherical, porous nickel particles have an average particle size of 0.1-25 µm.

9. The self-supporting nickel layer according to claim 2, wherein metal foils, metal foams, metal meshes, expanded metals, carbon foils, carbon foams, polymer foils or ceramic carriers are used as the carrier in step d).

10. A method for producing a nickel electrode according to claim 1, comprising the following steps:
    a) providing spherical nickel hydroxide particles,
    b) partially reducing the spherical nickel hydroxide particles in a reducing atmosphere at elevated temperatures to obtain partially reduced spherical Ni/NiO particles,
    c) preparing a paste from the Ni/NiO particles obtained and an organic and/or inorganic binder as well as further excipients as required,
    d) applying the paste in a layer to one or both sides of the electrically conductive nickel sheet, and
    e) tempering the coated nickel sheet in a reducing atmosphere at elevated temperatures.

11. A method for producing a self-supporting nickel layer according to claim 2, comprising the following steps:
    a) providing spherical nickel hydroxide particles,
    b) partially reducing the spherical nickel hydroxide particles in a reducing atmosphere at elevated temperatures to obtain partially reduced spherical Ni/NiO particles,
    c) preparing a paste from the Ni/NiO particles obtained and an organic and/or inorganic binder as well as further excipients as required,
    d) applying the paste in a layer to a carrier,
    e) tempering the coated carrier in a reducing atmosphere at elevated temperatures, and f) separating the carrier to obtain the self-supporting porous nickel layer.

12. The nickel electrode according to claim 3, wherein the spherical nickel hydroxide particles provided in step a) have an average particle size from 3-30 µm.

13. The nickel electrode according to claim 12, wherein the spherical nickel hydroxide particles provided in step a) have an average particle size from 9-12 µm.

14. The nickel electrode according to claim 13, wherein the spherical nickel hydroxide particles provided in step a) have an average particle size of about 10 µm.

15. The self-supporting nickel layer according to claim 2, wherein the spherical nickel hydroxide particles provided in step a) have an average particle size from 0.3-75 µm.

16. The self-supporting nickel layer according to claim 15, wherein the spherical nickel hydroxide particles provided in step a) have an average particle size from 3-30 µm.

17. The self-supporting nickel layer according to claim 16, wherein the spherical nickel hydroxide particles provided in step a) have an average particle size from 9-12 µm.

18. The self-supporting nickel layer according to claim 17, wherein the spherical nickel hydroxide particles provided in step a) have an average particle size of about 10 µm.

19. The nickel electrode according to claim 4, wherein the partial reduction in step b) is carried out at temperatures from 290-310° C.

20. The self-supporting nickel layer according to claim 2, wherein the partial reduction in step b) is carried out at temperatures from 270-330° C.

21. The self-supporting nickel layer according to claim 20, wherein the partial reduction in step b) is carried out at temperatures from 290-310° C.

22. The self-supporting nickel layer according to claim 2, wherein the partial reduction in step b) and the tempering in step e) are carried out in a reducing atmosphere containing 10-100% hydrogen and optionally an inert gas.

23. The self-supporting nickel layer according to claim 2, wherein in step c) natural and/or synthetic polymers or derivatives thereof are used as organic binders, and ammonium salts or hydrazine salts are used as inorganic binders.

24. The nickel electrode according to claim 7, wherein the nickel layer of the nickel electrode has a thickness in the range from 10-900 µm.

25. The nickel electrode according to claim 24, wherein the nickel layer of the nickel electrode has a thickness in the range from 20-200 µm.

26. The self-supporting nickel layer according to claim 2, wherein the self-supporting nickel layer has a thickness in the range from 1-1,000 µm.

27. The self-supporting nickel layer according to claim 26, wherein the self-supporting nickel layer has a thickness in the range from 10-900 µm.

28. The self-supporting nickel layer according to claim 27, wherein the self-supporting nickel layer has a thickness in the range from 20-200 µm.

29. The nickel electrode according to claim 8, wherein the spherical, porous nickel particles have an average particle size of 1-10 µm.

30. The nickel electrode according to claim 29, wherein the spherical, porous nickel particles have an average particle size of 2-6 µm.

31. The nickel electrode according to claim 30, wherein the spherical, porous nickel particles have an average particle size of 3-4 µm.

32. The self-supporting nickel layer according to claim 2, wherein the spherical, porous nickel particles have an average particle size of 0.1-25 µm.

33. The self-supporting nickel layer according to claim 32, wherein the spherical, porous nickel particles have an average particle size of 1-10 µm.

34. The self-supporting nickel layer according to claim 33, wherein the spherical, porous nickel particles have an average particle size of 2-6 µm.

35. The self-supporting nickel layer according to claim 34, wherein the spherical, porous nickel particles have an average particle size of 3-4 µm.

* * * * *